(12) United States Patent
Peng et al.

(10) Patent No.: US 11,908,789 B2
(45) Date of Patent: Feb. 20, 2024

(54) SELECTIVE FORMATION OF CONDUCTOR NANOWIRES

(71) Applicant: Taiwan Semiconductor Manufacturing Company, Ltd., Hsinchu (TW)

(72) Inventors: Chao-Hsien Peng, Zhubei (TW); Hsiang-Huan Lee, Jhudong Township (TW); Shau-Lin Shue, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/691,898

(22) Filed: Nov. 22, 2019

(65) Prior Publication Data

US 2020/0091068 A1     Mar. 19, 2020

Related U.S. Application Data

(62) Division of application No. 14/304,272, filed on Jun. 13, 2014, now Pat. No. 10,490,497.

(51) Int. Cl.
*H01L 23/522* (2006.01)
*H01L 21/3213* (2006.01)
(Continued)

(52) U.S. Cl.
CPC .... *H01L 23/5226* (2013.01); *H01L 21/28556* (2013.01); *H01L 21/32139* (2013.01);
(Continued)

(58) Field of Classification Search
CPC ............. H01L 21/76885; H01L 23/528; H01L 23/5266; H01L 23/5283; H01L 21/76816; H01L 23/5226
See application file for complete search history.

(56) References Cited

U.S. PATENT DOCUMENTS 4,810,332 A    3/1989 Pan
6,307,265 B1   10/2001 Anand et al.
(Continued)

FOREIGN PATENT DOCUMENTS

CN    101103459 A    1/2008
CN    101297391 A    10/2008

OTHER PUBLICATIONS

Bien et al., "Selective formation of tungsten nanowires," Nanoscale Research Letters, 2011, 6:543, http://www.nanoscalereslett.com/content/6/15/543, 5 pages.
(Continued)

*Primary Examiner* — Samuel A Gebremariam
*Assistant Examiner* — Jonas T Beardsley
(74) *Attorney, Agent, or Firm* — Slater Matsil, LLP

(57) ABSTRACT

A method includes etching a mandrel layer to form mandrel strips, and selectively depositing metal lines on sidewalls of the mandrel strips. During the selective deposition, top surfaces of the mandrel strips are masked by dielectric masks. The method further includes removing the mandrel layer and the dielectric masks, filling spaces between the metal lines with a dielectric material, forming via openings in the dielectric material, with top surfaces of the metal lines exposed to the via openings, and filling the via openings with a conductive material to form vias.

20 Claims, 15 Drawing Sheets

(51) Int. Cl.
*H01L 21/768* (2006.01)
*H01L 21/285* (2006.01)
*H01L 23/532* (2006.01)

(52) U.S. Cl.
CPC .. *H01L 21/76879* (2013.01); *H01L 21/76885* (2013.01); *H01L 23/53223* (2013.01); *H01L 23/53238* (2013.01); *H01L 23/53266* (2013.01); *H01L 2924/0002* (2013.01)

(56) References Cited

U.S. PATENT DOCUMENTS

| | | |
|---|---|---|
| 6,355,555 B1 | 3/2002 | Park |
| 6,632,741 B1 | 10/2003 | Clevenger et al. |
| 2004/0134768 A1 | 7/2004 | Wang et al. |
| 2004/0134769 A1 | 7/2004 | Wang et al. |
| 2004/0222082 A1 | 11/2004 | Gopalraja et al. |
| 2004/0251142 A1 | 12/2004 | Cohen et al. |
| 2006/0267198 A1* | 11/2006 | Lin .................. H01L 23/53238 257/E23.152 |
| 2007/0049030 A1 | 3/2007 | Sandhu et al. |
| 2007/0207604 A1 | 9/2007 | Furukawa et al. |
| 2009/0093100 A1* | 4/2009 | Xia .................. H01L 21/76832 438/421 |
| 2011/0260288 A1* | 10/2011 | Sukekawa ............ H10B 12/315 257/532 |
| 2011/0278735 A1* | 11/2011 | Yen .................... H01L 21/76898 257/774 |
| 2012/0199942 A1* | 8/2012 | Kageyama .......... H01L 23/5256 257/E23.149 |
| 2012/0329267 A1 | 12/2012 | Horak et al. |
| 2013/0020700 A1* | 1/2013 | Liu ....................... H01L 23/481 257/737 |
| 2013/0043560 A1* | 2/2013 | Tzeng ................. H01L 23/5223 257/532 |
| 2013/0082314 A1* | 4/2013 | Summerfelt .......... H01L 23/528 257/295 |
| 2013/0093055 A1* | 4/2013 | Lee ....................... H01L 27/016 257/536 |
| 2013/0119474 A1 | 5/2013 | Schultz |
| 2014/0197538 A1* | 7/2014 | Lu ..................... H01L 21/76892 257/751 |
| 2015/0137388 A1* | 5/2015 | Kim ..................... H01L 23/481 257/774 |
| 2015/0214135 A1* | 7/2015 | Aya .................. H01L 27/10885 257/774 |

OTHER PUBLICATIONS

Tsubouchi, Kasuo et al., "Selective aluminum chemical vapor deposition," J. Vac. Sci. Technolo. A. 10, 856, AVS: Science & Technology of Materials, Interfaces, and Processing, Sep. 3, 1991, 8 pages.

\* cited by examiner

SELECTIVE FORMATION OF CONDUCTOR NANOWIRES

CROSS-REFERENCE TO RELATED APPLICATIONS

This application is a divisional of U.S. patent application Ser. No. 14/304,272, filed on Jun. 13, 2014 (issued on Nov. 26, 2019 as U.S. Pat. No. 10,490,497) and entitled "Selective Formation of Conductor Nanowires," which application is hereby incorporated herein by reference.

BACKGROUND

In the formation of integrated circuits, semiconductor devices are formed on semiconductor substrates, and are then connected through metal layers.

Typically, the formation process of a metal layer includes forming an Inter-Metal Dielectric (IMD), forming trenches and via openings in the IMD, and filling a metallic material in the trenches and via openings to form metal lines and vias, respectively. With the increasing down-scaling of integrated circuits, however, the above-discussed processes experience shortcomings. While the horizontal dimensions (for example, the poly-to-poly pitch between neighboring polysilicon lines) are continuously shrinking, the sizes of the metal lines and vias are reduced. The thickness of the IMD, however, is not reduced accordingly to the same scale as the reduction of the widths of the metal lines and vias. Accordingly, the aspect ratios of the metal lines and vias increase, causing the metal layer formation to be increasingly more difficult.

The down-scaling of integrated circuits results in several problems. First, it is increasingly more difficult to fill the trenches and via openings without causing seam holes (voids) therein. In addition, when the lateral sizes of the metal lines and vias reduce, the sizes of seam holes do not reduce proportionally. This not only causes the effective area of the metal lines and vias for conducting currents to reduce non-proportionally, but also results in the subsequently formed etch stop layers and metal lines to fall into the seam holes, and hence results in reliability problems. As a result, the process window for forming the metal lines and vias becomes narrower and narrower, and the formation of the metal lines and vias has become the bottleneck for the down-scaling of integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
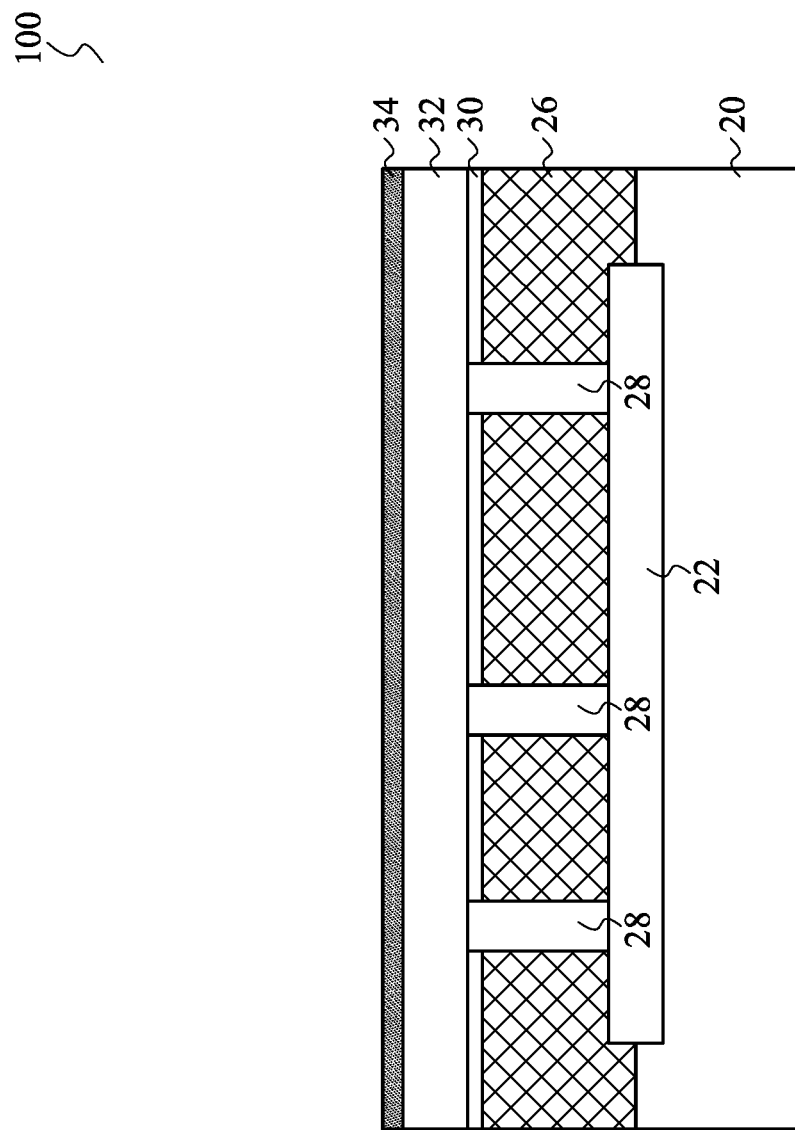
FIGS. 1 through 11 illustrate the cross-sectional views of intermediate stages in the formation of metal lines and vias in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An interconnect structure and the method of forming the same are provided in accordance with various exemplary embodiments. The intermediate stages of forming the interconnect structure are illustrated. The variations of the embodiments are discussed. Throughout the various views and illustrative embodiments, like reference numbers are used to designate like elements.

FIGS. 1 through 11 illustrate the cross-sectional views of intermediate stages in the formation of an interconnect structure including metal lines and vias in accordance with some embodiments. The steps shown in FIGS. 1 through 11 are also illustrated schematically in the process flow shown in FIG. 13. In the subsequent discussion, the process steps shown in FIGS. 1 through 11 are discussed referring to the process steps in FIG. 13.

FIG. 1 illustrates wafer 100, which includes substrate 20 and the features formed at a top surface of substrate 20. In accordance with some embodiments, substrate 20 is a semiconductor substrate, which may comprise crystalline silicon, crystalline germanium, silicon germanium, a III-V compound semiconductor such as GaAsP, AlInAs, AlGaAs, GaInAs, GaInP, GaInAsP, and/or the like. Semiconductor substrate 20 may also be a bulk silicon substrate or a Silicon-On-Insulator (SOI) substrate. Shallow Trench Isolation (STI) region(s) (not shown) may be formed in semiconductor substrate 20 to isolate the active regions in semiconductor substrate 20.

In accordance with some embodiments of the present disclosure, integrated circuit devices 22 are formed at the surface of semiconductor substrate 20. Integrated circuit devices 22 may include active devices such as P-type Metal-Oxide-Semiconductor (PMOS) transistors or N-type Metal-Oxide-Semiconductor (NMOS) transistors and diodes, passive devices such as capacitors, inductors, resistors, and/or the like.

Inter-Layer Dielectric (ILD) 26 is formed over semiconductor substrate 20. In some exemplary embodiments, ILD 26 comprises phosphosilicate glass (PSG), borosilicate glass (BSG), boron-doped phosphosilicate glass (BPSG), fluorine-doped silicate glass (FSG), tetraethyl orthosilicate (TEOS), or the like.

Contact plugs 28 are formed in ILD 26. In accordance with some embodiments of the present disclosure, contact plugs 28 are formed of a material selected from tungsten, aluminum, copper, titanium, tantalum, titanium nitride, tantalum nitride, alloys therefore, and/or multi-layers thereof. For example, contact plugs 28 may include a conductive barrier layer (not shown) comprising titanium, titanium nitride, tantalum, or tantalum nitride, and copper or a copper alloy over the conductive barrier layer. Contact plugs 28 may include gate contact plugs that are connected to the gate electrodes of MOS transistors, and sourced/drain contact plugs that are connected to the source and drain regions of the MOS transistors.

In some embodiments of the present disclosure, although contact plugs 28 are used as an example to explain the concept of the present disclosure, features 28 may also be any other type of conductive features including, and not limited to, doped semiconductor regions (such as crystalline silicon or polysilicon), metal lines, vias, metal pads, etc.

Etch stop layer 30 is formed over contact plugs 28 and ILD 26. Etch stop layer 30 may comprise a dielectric material such as silicon carbide, silicon oxynitride, silicon carbonitride, or the like.

Mandrel layer 32 is formed over etch stop layer. In accordance with some embodiments, mandrel layer 32 comprises a material from which the subsequently formed metal lines 38 (FIG. 4) can selectively grow. In accordance with some embodiments, mandrel layer 32 includes silicon, which may be amorphous silicon, polycrystalline silicon, or the like. The formation of mandrel layer 32 may include a Chemical Vapor Deposition (CVD) method.

Over mandrel layer 32 is mask layer 34. In accordance with some embodiments, mask layer 34 comprises a dielectric material selected from SiN, $SiO_2$, SiON, SiCN, SiOCN, AlON, AlN, combinations thereof, and/or multi-layers thereof.

Figure 2:
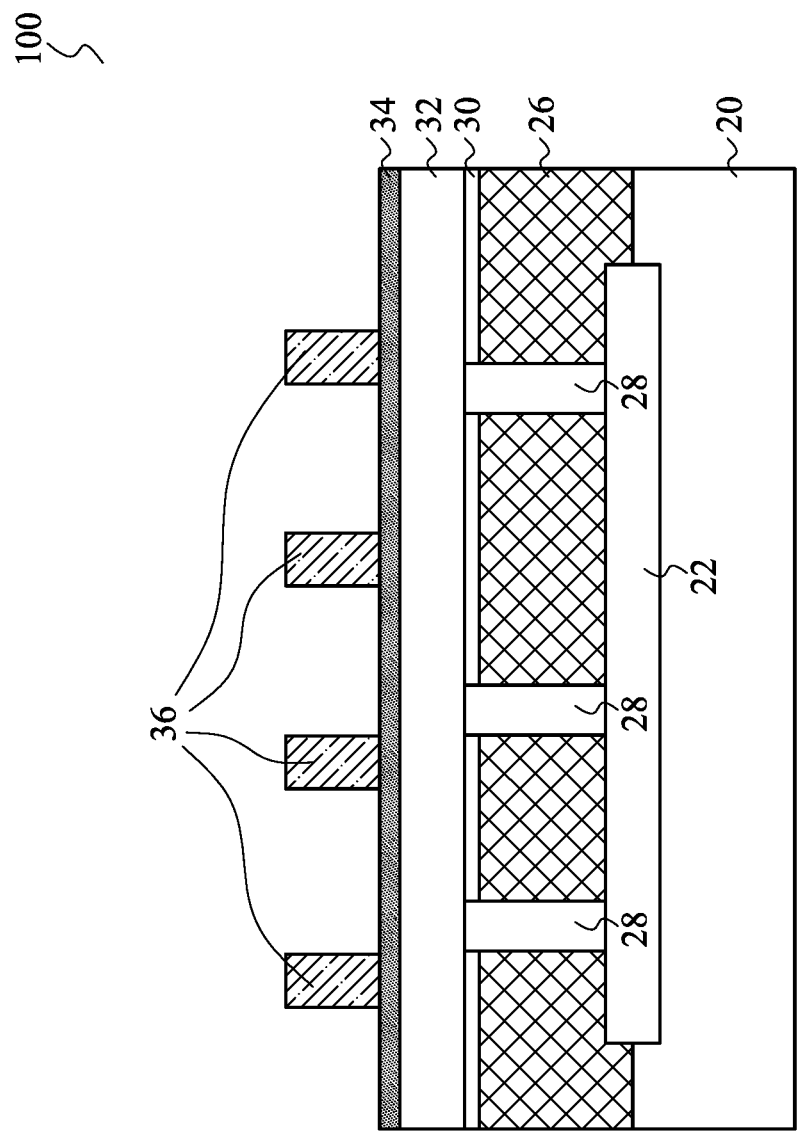

Next, FIGS. 2 through 5B illustrate the cross-sectional views for forming conductive lines 38 (FIGS. 5A and 5B), which may be metal lines in some embodiments. Referring to FIG. 2, etching mask layer 36 is formed/applied over wafer 100, and is then patterned. In accordance with some embodiments, etching mask layer 36 includes a tri-layer, which includes an under layer, a middle layer over the under layer, and an upper layer over the middle layer. In alternative embodiments, etching mask layer 36 is a single-layer photo resist or a double-layer. In some embodiments, the under layer and the upper layer are formed of photo resists, which include organic materials. The middle layer may include an inorganic material, which may be a nitride (such as silicon nitride), an oxynitride (such as silicon oxynitride), an oxide (such as silicon oxide), or the like. The middle layer may also include the mix of silicon and an organic material. The middle layer has a high etching selectivity relative to the upper layer and the under layer, and hence the upper layer may be used as an etching mask for the patterning of the middle layer, and the middle layer may be used as an etching mask for the patterning of the under layer.

Figure 3:
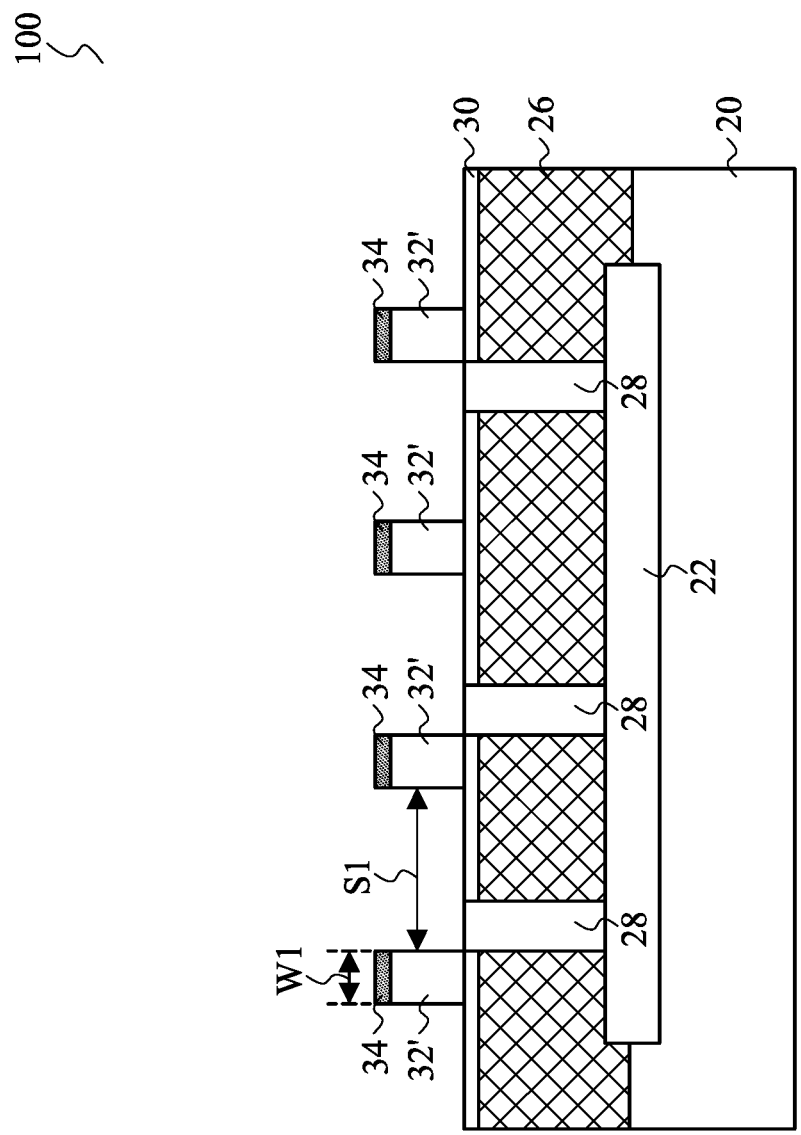

FIG. 3 illustrates the etching of mask layer 34 and mandrel layer 32. The respective step is shown as step 202 in the process flow 200 shown in FIG. 13. In accordance with some embodiments, the etching is performed until mandrel layer 32 is etched-through, hence exposing the underlying contact plugs 28 and etch stop layer 30. After the etching step, the remaining portions of etching mask layer 36 (FIG. 2), which may include photo resist, are removed if they are not consumed in the etching step. As a result, a plurality of mandrel strips 32' is formed. The spacing between neighboring mandrel strips 32' is S1. The width of mandrel strips 32' is W1. In accordance with some embodiments, spacing S1 is greater than width W1. Furthermore, spacing S1 may be close to about three times the width W1 in some exemplary embodiments. After the formation of mandrel strips 32', some of contact plugs 28 are located on one or both sides of, and are close to, some of mandrel strips 32'. For example, a contact plug 28 may have one of its edges aligned to an edge of the respective neighboring mandrel strip 32'.

Figure 4:
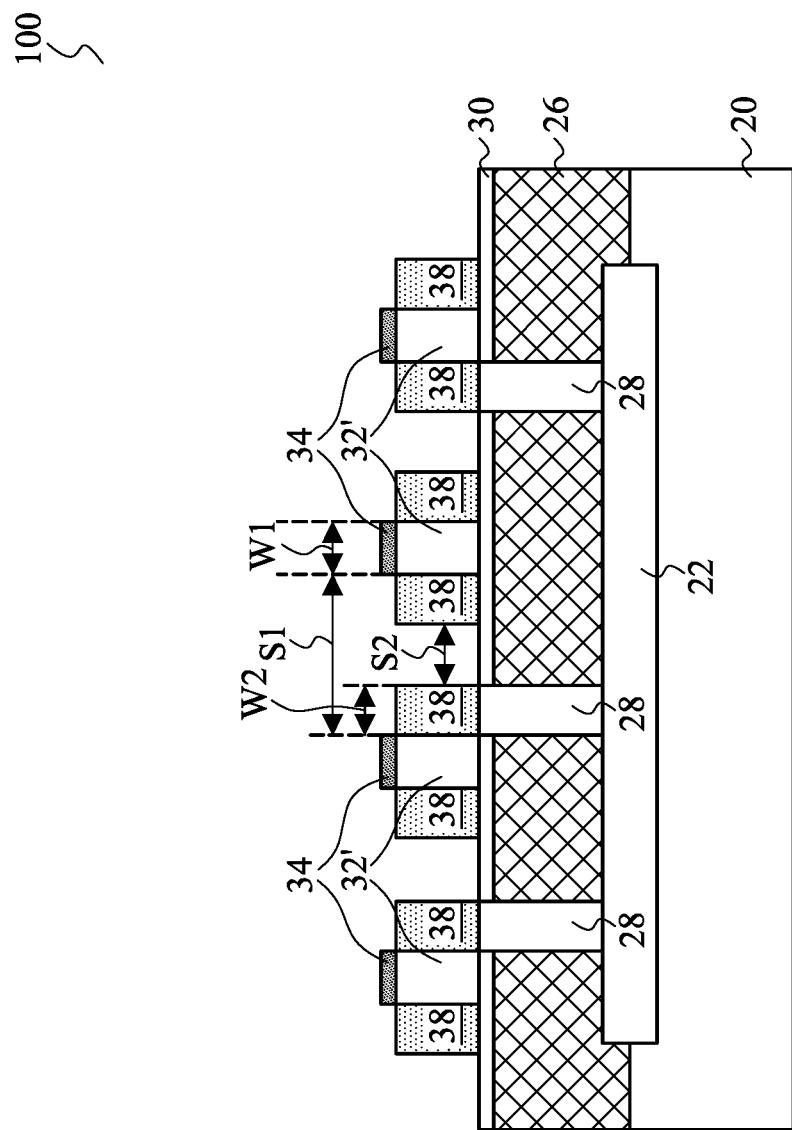

Next, as shown in FIG. 4, a selective growth is performed to deposit and grow a conductive material on the exposed sidewall surfaces of mandrel strips 32', hence metal lines 38 are formed. The respective step is shown as step 204 in the process flow 200 shown in FIG. 13. Metal lines 38 may be metal strips, which may comprise tungsten, aluminum, copper, or alloys of these materials. The growth is selective, so that metal lines 38 are grown on the sidewall surfaces of mandrel strips 32' and the exposed surfaces of contact plugs 28, but not on the exposed surfaces of mask layers 34 and etch stop layer 30. Hence, the dielectric materials of mask layer 34 and etch stop layer 30 prevents the deposition of the conductive material.

The selective growth may be performed through Chemical Vapor Deposition (CVD). For example, in the embodiments in which metal lines 38 comprise tungsten, the following chemical reaction formula may occur:

$$2WF_6 + 3Si \rightarrow 2W + 3SiF_4 \qquad [Eq. 1]$$

wherein $WF_6$ and $SiF_4$ are gases, and Si is in the form of a solid, for example, in the form of mandrel strips 32'. The gaseous $WF_6$ is introduced into the reaction chamber for forming metal lines 38, and the gaseous $SiF_4$ is evacuated from the reaction chamber, leaving metal lines 38 on the sidewalls of mandrel strips 32'.

In the embodiments in which metal lines 38 comprise aluminum, the following chemical reaction formula may occur:

$$2AlH(CH_3)_2 + H_2 \rightarrow 2Al + 4CH_4 \qquad [Eq. 2]$$

wherein $AlH(CH_3)_2$ and $H_2$ are gases. The gaseous $CH_4$ is introduced into the reaction chamber for forming metal lines 38, and the gaseous $CH_4$ is evacuated from the reaction chamber, leaving metal lines 38 on the sidewalls of mandrel strips 32'.

In accordance with some embodiments of the present disclosure, the formation of metal lines 38 is performed using a CVD method. In some exemplary embodiments, during the chemical reaction, the temperature of wafer 100 may be in the range between about 100° C. and about 400° C. The process gases have a pressure in the range between about 1 torr and about 100 torr. The reaction gases may include a copper containing gas, a tungsten containing gas (such as $WF_6$), or an aluminum containing gas (such as $AlH(CH_3)_2$), depending on what kind of metal is comprised in metal lines 38. In addition, other process gases such as $H_2$, $NH_3$, and some carrier gases such as $N_2$, Ar, or the like may also be included in the process gases.

The width W2 of metal lines 38 is smaller than a half of spacing S1. In some exemplary embodiments, width W2 is equal to or substantially equal to about one third of spacing S1. For example, the absolute value of difference |W1−S1/3| may be smaller than about 10 percent the value (S1)/3. Accordingly, the metal lines 38 grown from the neighboring mandrel strips 32' do not join with each other, and the spacing S2 between neighboring metal lines 38 may be close to width W1 of mandrels 32', which may also be close to width W2 of metal lines 38.

As illustrated in FIG. 4, some of metal lines 38 have their bottom surfaces in contact with the top surfaces of contact plugs 28. Accordingly, metal lines 38 are electrically coupled to the underlying contact plugs 28.

Figure 5A:
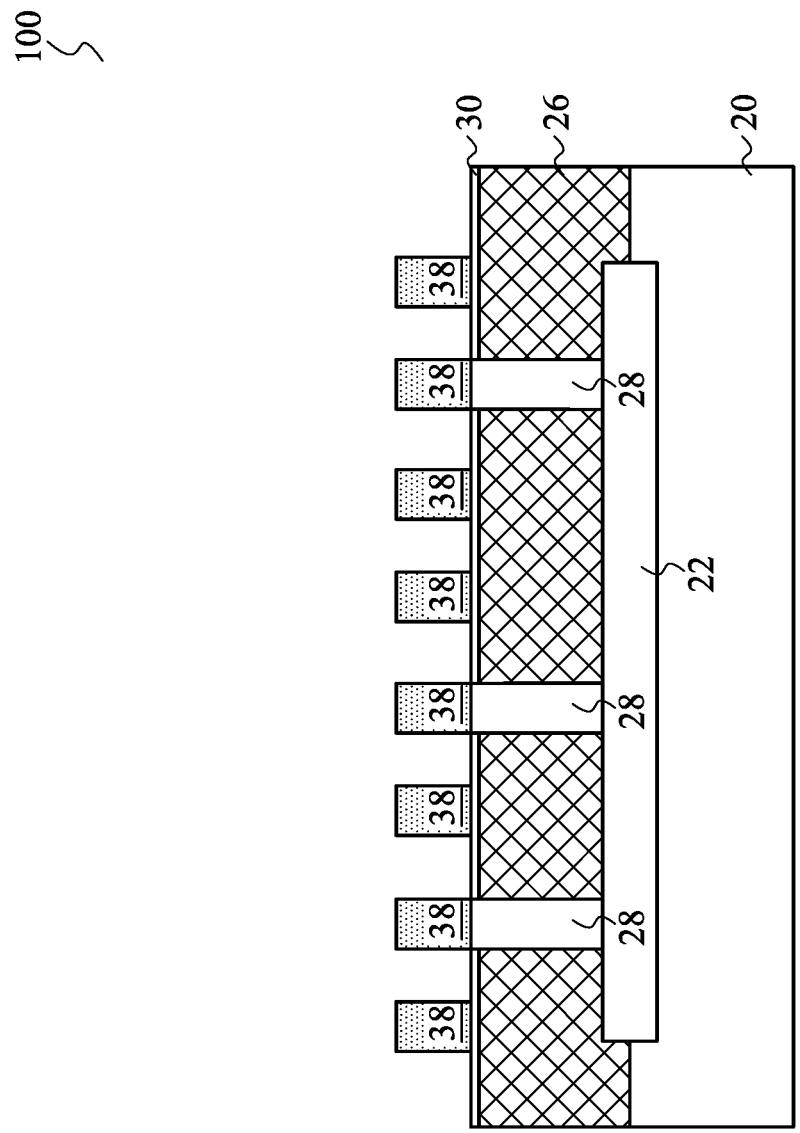
Figure 5B:
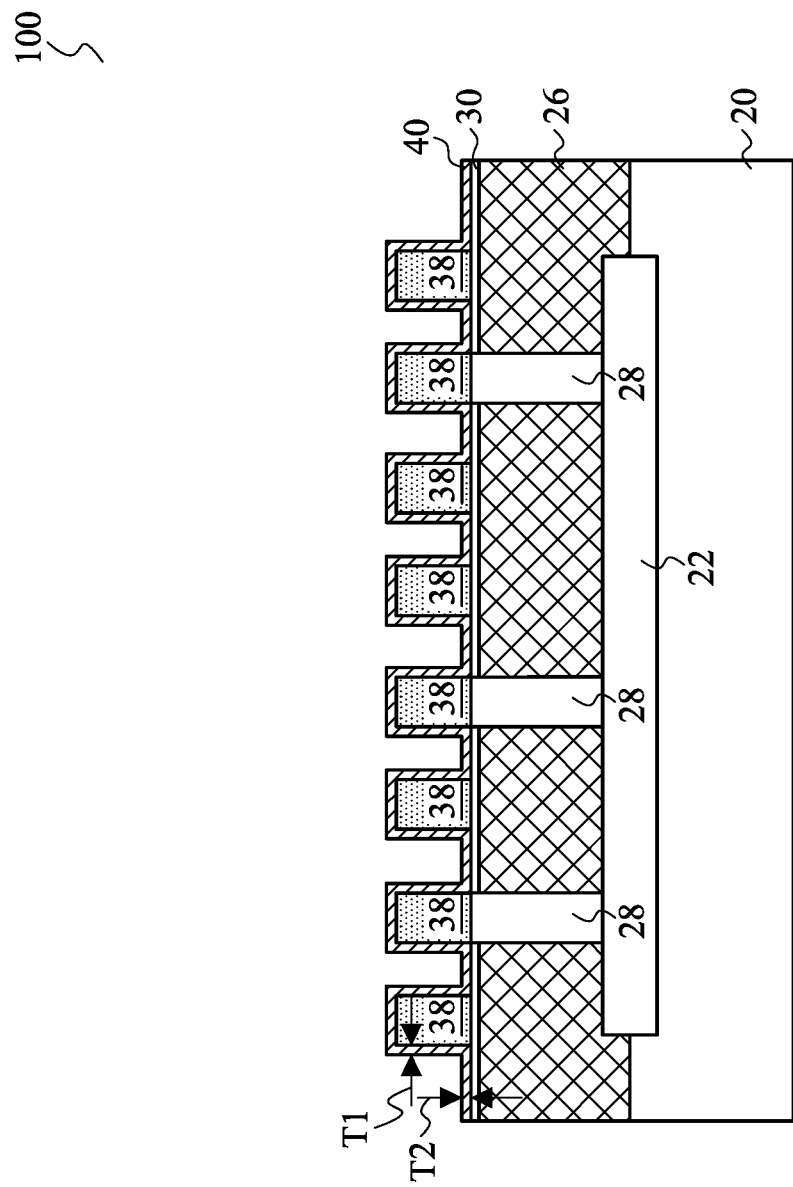

The remaining portions of mask layer 34 and mandrel strips 32' are removed in a selective etching step, leaving metal lines 38. The resulting structure is shown in FIGS. 5A and 5B, which are the structures formed in accordance with different embodiments. The respective step is also shown as step 206 in the process flow 200 shown in FIG. 13. In accordance with some embodiments, metal lines 38 include portions that are parallel to each other. It is realized that metal lines 38 may form a plurality of rings, each encircling one of mandrel strips 32' as in FIG. 4 and FIG. 14. Accordingly, after the formation of metal lines 38, a patterning step may be performed to remove some portions of metal lines 38, and to remove some undesirable metal lines 38. The remaining metal lines 38 include some portions overlying contact plugs 28, as shown in FIGS. 5A and 5B.

FIG. 5B illustrates the structure in accordance with alternative embodiments of the present application. The structure in FIG. 5B includes an additional dielectric barrier layer 40 in addition to the features shown in FIG. 5A. In accordance with some embodiments, for example, when metal lines 38 comprise copper, dielectric barrier layer 40 is formed on the top surfaces and sidewalls of metal lines 38. In come embodiments, dielectric barrier layer 40 is a conformal layer whose horizontal portions and vertical portions have thicknesses T1 and T2 equal to or substantially equal to each other. For example, the difference (|T1−T2| may be smaller than about 20 percent, and may be smaller than about 10 percent, both of thicknesses T1 and T2, wherein thickness T1 is the thickness of the vertical portions of dielectric barrier layer 40, and thickness T2 is the thickness of the horizontal portions of dielectric barrier layer 40. In alternative embodiments of the present disclosure, for example, when metal lines 38 are formed of aluminum and/or tungsten and are substantially free from copper, dielectric barrier layer 40 may not be formed, and the subsequently formed IMD 42 (FIG. 6) is in contact with metal lines 38.

Figure 6:
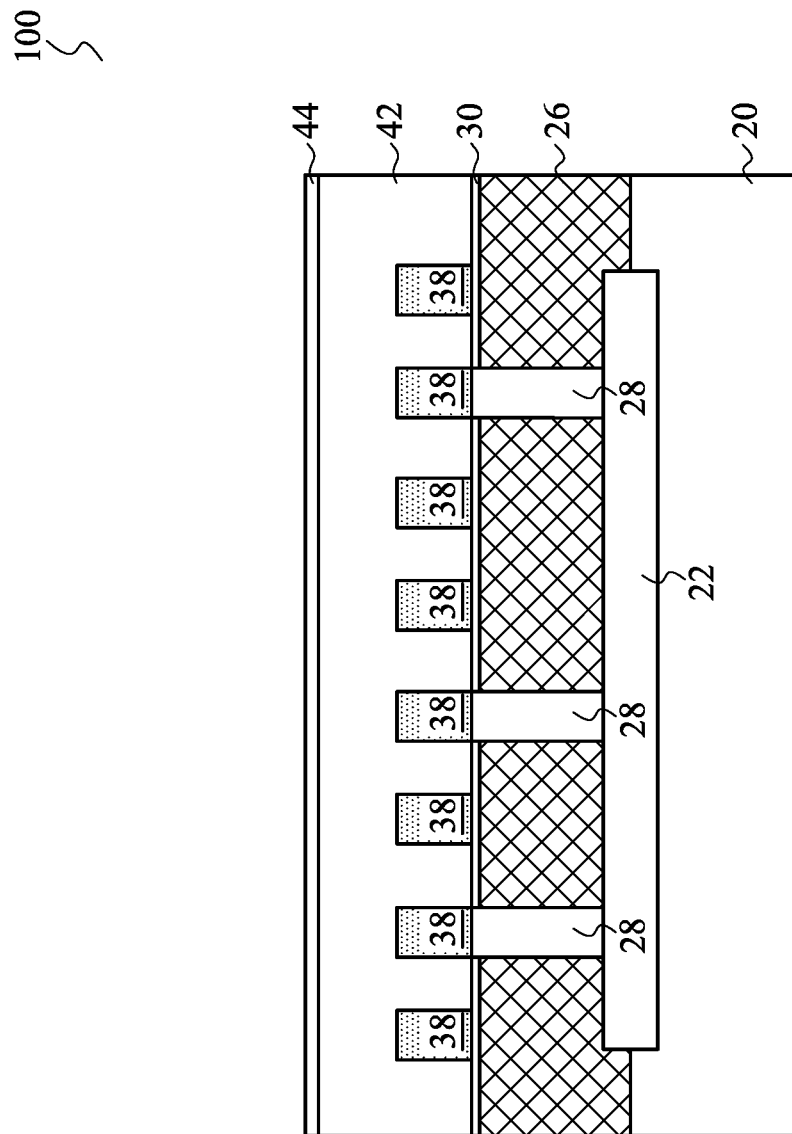

Referring to FIG. 6, Inter-Layer Dielectric (IMD) 42 is formed over etch stop layer 30. The respective step is shown as step 208 in the process flow 200 shown in FIG. 13. In accordance with some embodiments, IMD 42 comprises a low-k dielectric material having a dielectric constant (k-value) lower than about 3.0, for example. IMD 42 may comprise black diamond (a registered trademark of Applied Materials), a carbon-containing low-k dielectric material, or the like. IMD 42 may be formed using spin coating, Flowable Chemical Vapor Deposition (FCVD), or the like. In alternative embodiments of the present disclosure, IMD 42 is formed using a deposition method such as Plasma Enhanced Chemical Vapor Deposition (PECVD), Low Pressure Chemical Vapor Deposition (LPCVD), or the like. The top surface of IMD 42 is higher than the top surfaces of metal lines 38.

In accordance with some embodiments, after the formation of IMD 42, etch stop layer 44 is formed. Etch stop layer 44 comprises a material different from the material of IMD 42. In some embodiments, etch stop layer 44 comprises silicon carbide, silicon oxynitride, silicon carbonitride, or the like.

Figure 7:
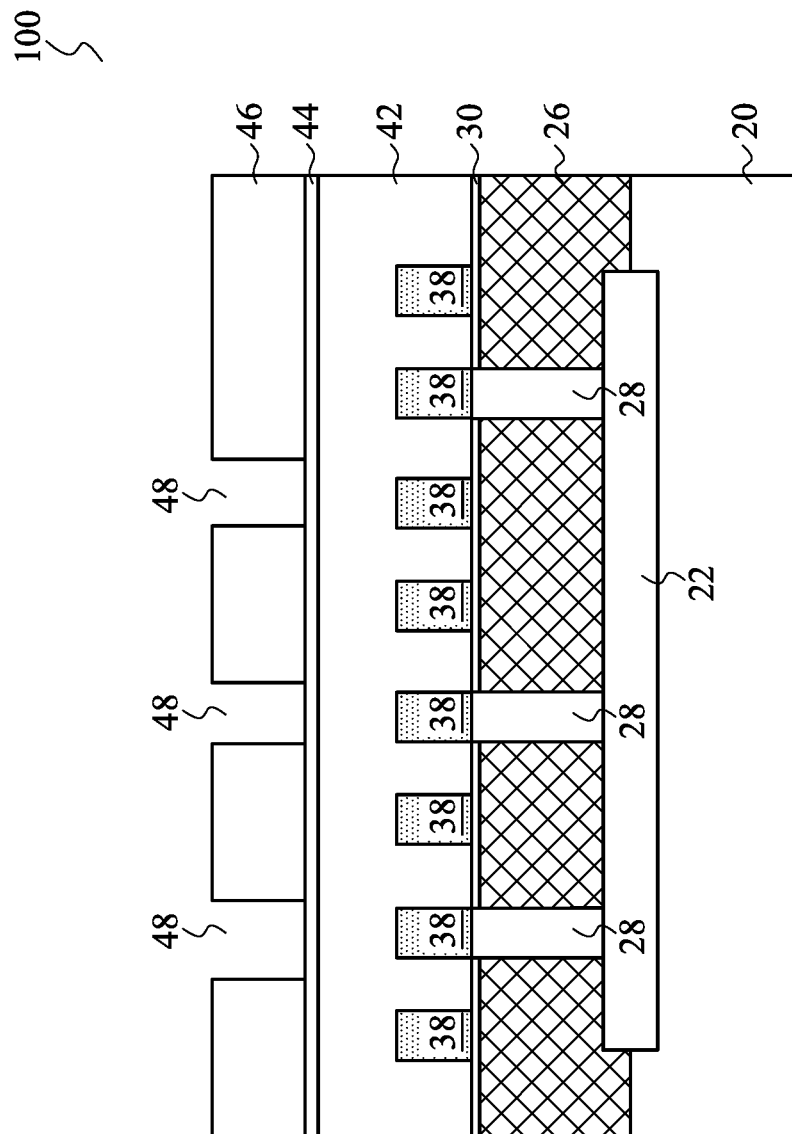
Figure 8:
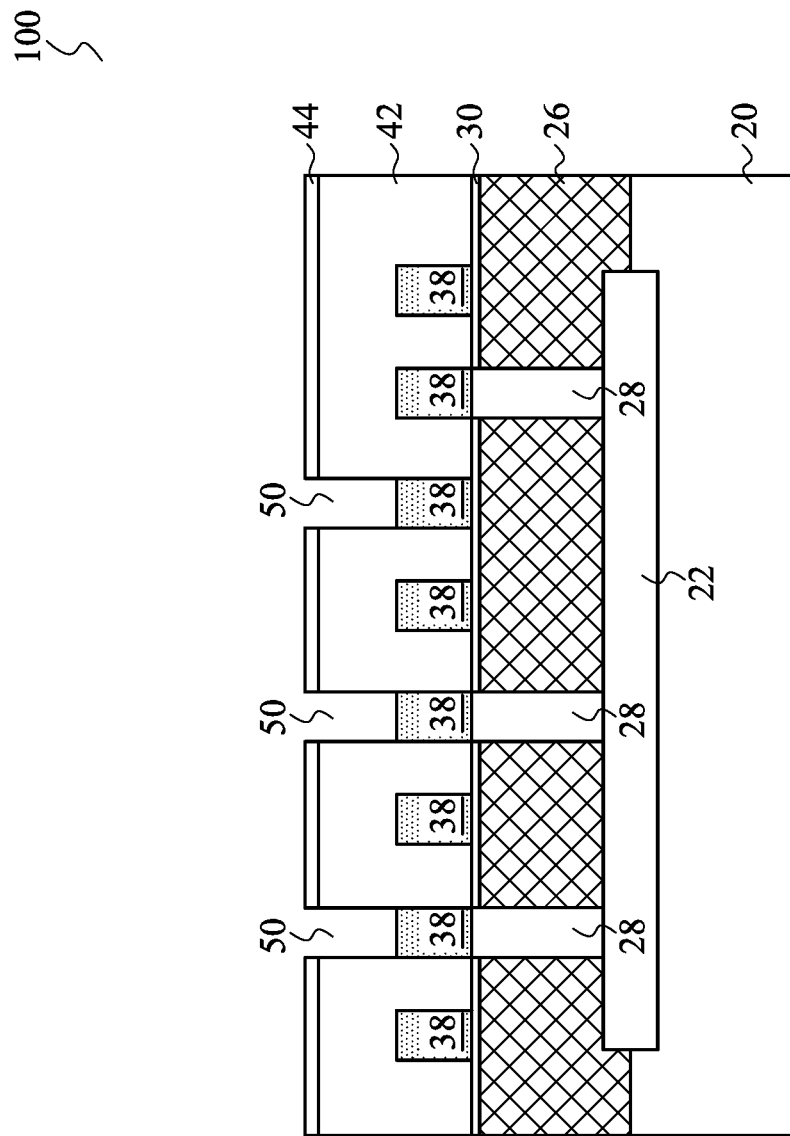
Figure 9:
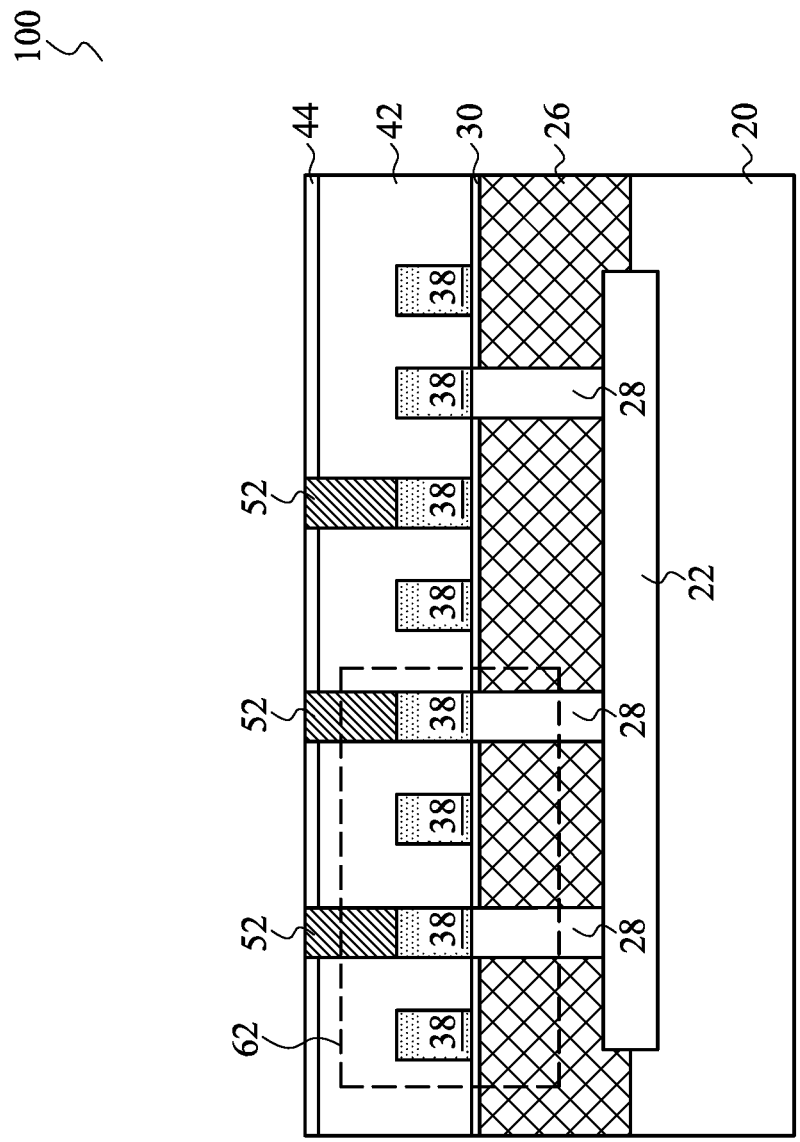

FIGS. 7 through 9 illustrate the cross-sectional views of intermediate stages in the formation of vias in accordance with some embodiments of the present disclosure. Referring to FIG. 7, photo resist 46 is applied over etch stop layer 44, followed by a patterning step to remove some portions of photo resist 46. Openings 48 are thus formed in photo resist 46.

Next, the patterned photo resist 46 is used as an etching mask to etch the underlying etch stop layer 44 and IMD 42, hence forming via openings 50 in IMD 42, as shown in FIG. 8. The respective step is shown as step 210 in the process flow 200 shown in FIG. 13. Photo resist 46 (FIG. 7) is then removed. Via openings 50 are aligned to some of metal lines 38, and hence after the etching step, the top surfaces of metal lines 38 are exposed. The etching may be performed using a time mode, so that if misalignment occurs, and via openings 50 undesirably shift off from the center of metal lines 38 slightly, the bottoms of the resulting via openings 50 are still higher than the bottom surface of IMD 42. In the case the misalignment occurs, the top surface and a sidewall of one (or more) of metal lines 38 may be exposed to the respective via opening 50. The bottom surface of via opening 50 is hence at an intermediate level between the top surfaces and the bottom surfaces of metal lines 38. Via openings 50 may have top-view shapes such as squares, circles, ellipses, or the like.

Referring to FIG. 9, vias 52 are formed in via openings 50 as in FIG. 8. The respective step is shown as step 212 in the process flow 200 shown in FIG. 13. In accordance with some embodiments of the present disclosure, the formation of vias 52 includes selectively depositing conductive materials such as metals in via openings 50, but not on the top surface of etch stop layer 44. Vias 52 may comprise tungsten, aluminum, copper, or alloys of these materials.

In accordance with some embodiments of the present disclosure, the formation of vias 52 is performed using a CVD method. During the respective chemical reaction, the temperature of wafer 100 may be in the range between about 100° C. and about 400° C. The process gases may have a pressure in the range between about 1 torr and about 100 torr. The reaction gases may include a copper containing gas, a tungsten containing gas (such as $WF_6$), or an aluminum containing gas (such as $AlH(CH_3)_2$), depending on what kind of metal is comprised in vias 52. As a result, vias 52 may include tungsten, aluminum, copper, or alloys thereof. In addition, other process gases such as $H_2$, $NH_3$, and some carrier gases such as $N_2$, Ar, or the like may also be included in the process gases used for forming vias 52. The formation of vias 52 is controlled, so that when the formation of vias 52 is concluded, the top surfaces of vias 52 are substantially level with, or slightly lower than, the top surface of etch stop layer 44.

In alternative embodiments of the present disclosure, the formation of vias 52 includes blanket depositing a conductive barrier layer (not illustrated separately), forming a seed layer such as a copper layer, and then performing a plating process such as electrical or electro-less plating to plate a metal such as copper or copper alloy. The conductive barrier layer may include titanium, titanium nitride, tantalum, tantalum nitride, or the like. A planarization such as a CMP is performed to remove excess portions of the conductive material, the seed layer, and the plated metal over the top surface of etch stop layer 44. The remaining portions of the conductive material, the seed layer, and the plated metal form vias 52.

Figure 10:
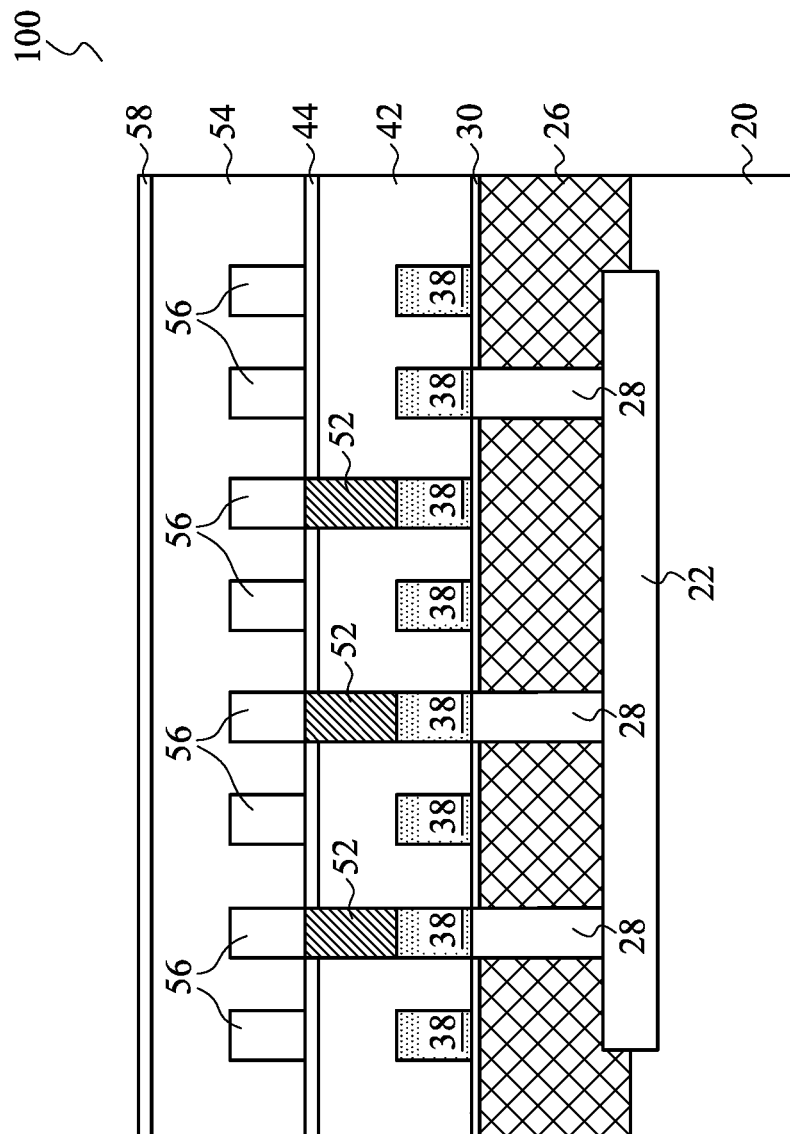
Figure 11:
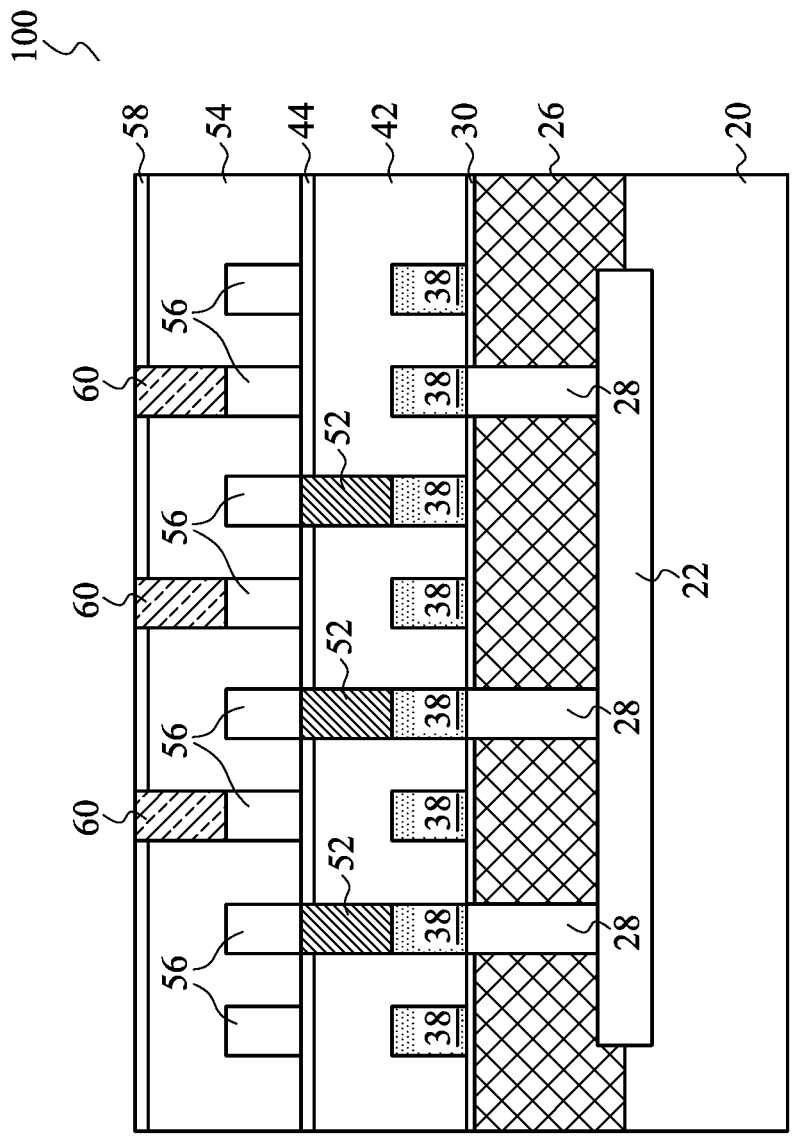

FIGS. 10 and 11 schematically illustrate the formation of an additional metal layer including metal lines 56 and the respective overlaying vias 60. FIG. 10 illustrates the formation of metal lines 56. The respective step is shown as step 214 in the process flow 200 shown in FIG. 13. Next, as also shown in FIG. 10, IMD 54 is formed to fill the spaces between metal lines 56, followed by the formation of etch stop layer 58. The formation details of metal lines 56, IMD 54, and etch stop layer 58 are essentially the same as illustrated in FIGS. 1 through 5B, with metal lines 56, IMD 54, and etch stop layer 58 corresponding to metal lines 38, IMD 42, and etch stop layer 44, respectively. The details for forming the structure in FIG. 10 are hence not repeated herein.

FIG. 11 illustrates the formation of vias 60. The respective step is shown as step 216 in the process flow 200 shown in FIG. 13. The formation process and the materials are essentially the same as that for forming vias 52, and hence are not repeated herein. In subsequent processes, more metal layers and the respective vias may be formed over the structure in FIG. 11, with the metal lines and vias electrically connected to metal lines 38 and 56 and vias 52 and 60.

Figure 12:
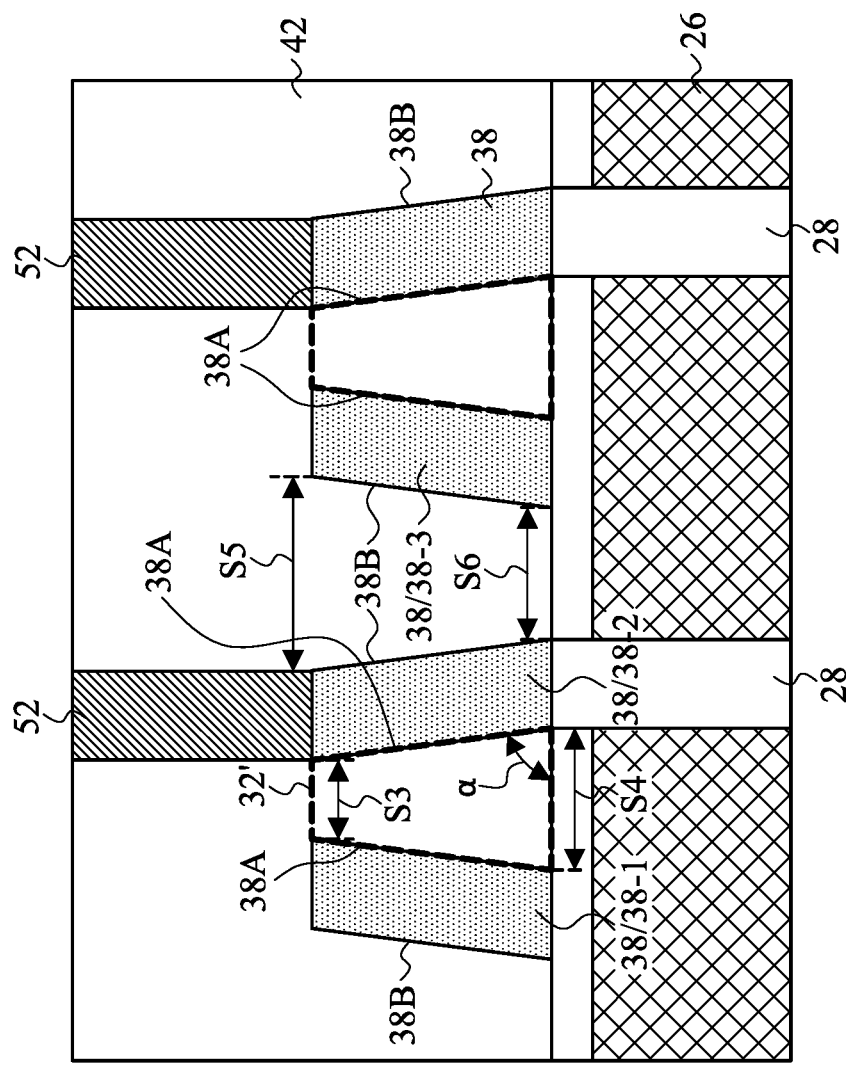
FIG. 12 illustrates a magnified view of portions of metal lines and vias.

FIG. 12 illustrates a magnified view of a portion of the metal lines 38 and vias 52, wherein the magnified view illustrates the portion 62 in FIG. 9. The mandrel strips 32' are shown in FIG. 12 using dashed lines since mandrel strips 32' no longer exist in FIG. 12 (which corresponds to the step shown in FIG. 9). It is appreciated that since mandrel strips 32' (FIG. 4) are formed by etching mandrel layer 32 (FIG. 1), the mandrel strips 32' may have top widths smaller than the respective bottom widths, and may have inversed trapezoid shapes. As a result, metal lines 38 have tilted sidewalls 38A and 38B that are opposite to each other. Tilt angle α of tilted sidewalls 38A and 38B may be smaller than 90 degrees and greater than about 80 degrees in some embodiments. Furthermore, opposite sidewalls 38A and 38B of the same metal line 38 may be substantially parallel to each other. In addition, two of the neighboring metal lines 38 (such as 38-1 and 38-2) have their upper side tilting toward each other. Alternatively stated, distance S3 between a top portion of the sidewall 38A of metal line 38-1 and a top portion of the sidewall 38A of metal line 38-2 is smaller than distance S4 between the bottom portions of the sidewalls 38A of metal lines 38-1 and 38-2.

Furthermore, two of the neighboring metal lines 38 (such as 38-2 and 38-3) may have their upper side tilting away from each other. Alternatively stated, distance S5 between a top portion of the sidewall 38A of metal line 38-2 and a top portion of the sidewall 38A of metal line 38-3 is greater than distance S6 between the bottom portions of the sidewalls 38A of metal lines 38-2 and 38-3. The pattern of the tilted metal lines 38 as shown in FIG. 12 may be repeated.

Figure 13:
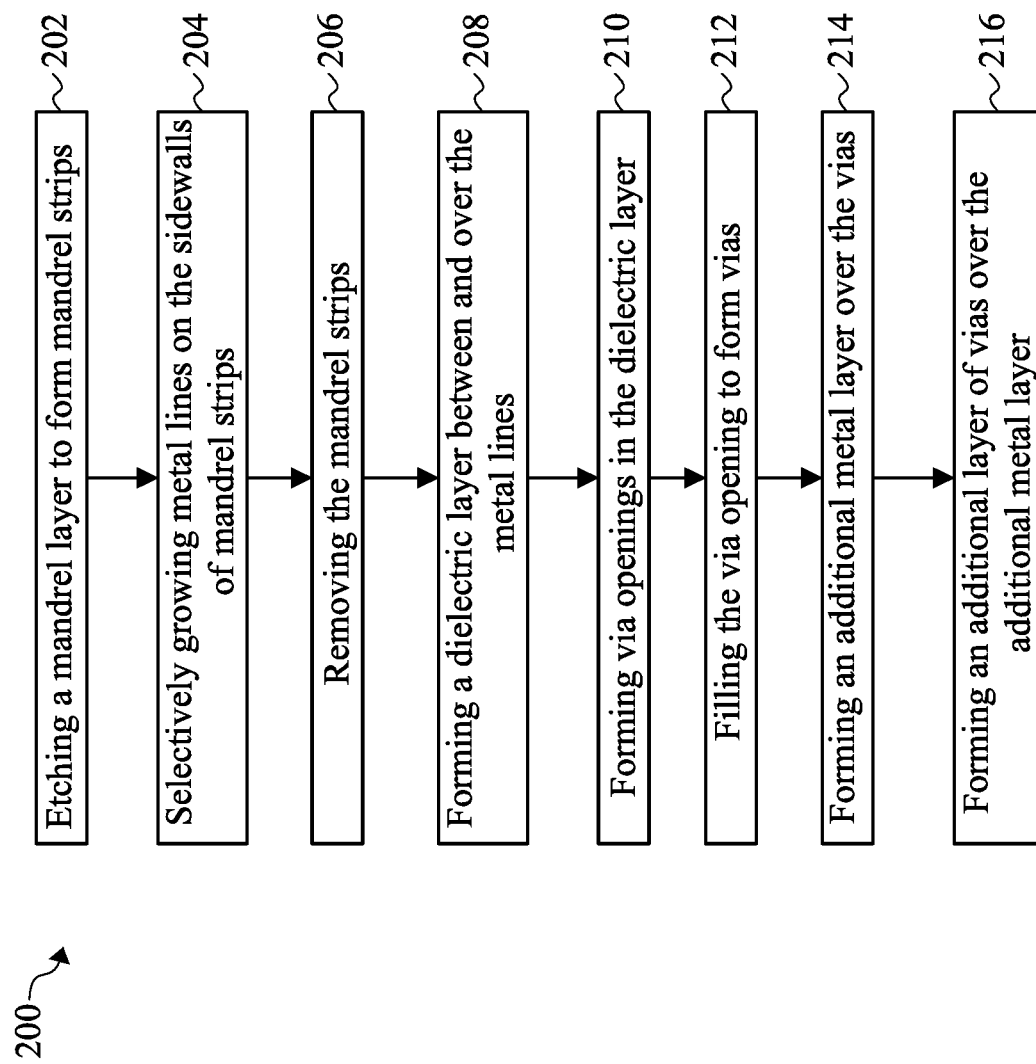
FIG. 13 illustrates a process flow for forming metal lines and vias in accordance with some embodiments.
Figure 14:
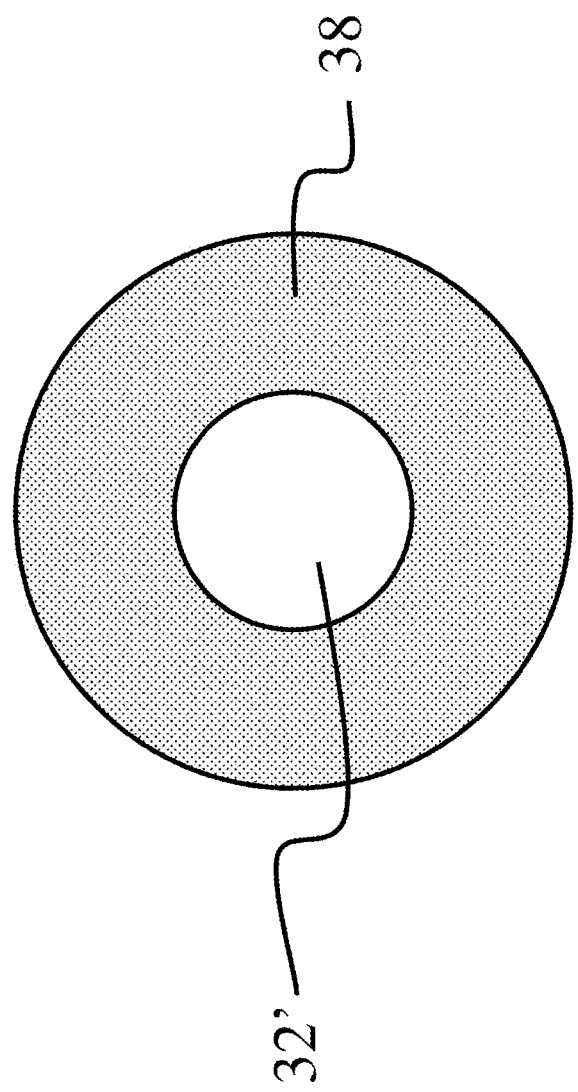
FIG. 14 illustrates a metal line in a top-down view in accordance with some embodiments.

FIG. 13 schematically illustrates the process flow 200 for the processes shown in FIGS. 1 through 11. The process flow is briefly discussed herein. The details of the process flow may be found in the discussion of FIGS. 1 through 11. In step 202, mandrel strips 32' are formed, as shown in FIGS. 1 through 3. In step 204 of the process flow in FIG. 13, metal lines 38 are selectively deposited on the exposed sidewalls of mandrel strips 32', and the respective formation process is illustrated in FIG. 4. In step 206 of the process flow in FIG. 13, mandrels strips 32' are removed, leaving metal lines 38, and the respective formation process is illustrated in FIG. 5. In step 208 of the process flow in FIG. 13, IMD 42 is formed to fill the spaces between metal lines 38, and the respective formation process is illustrated in FIG. 6. In step 210 of the process flow in FIG. 13, via openings are formed in IMD 42, and the respective formation process is illustrated in FIG. 7. In step 212 of the process flow in FIG. 13, vias 52 are formed in the via openings, and the respective formation process is illustrated in FIG. 9. In step 214 of the process flow in FIG. 13, an additional metal layer including metal lines 56 is formed, and the respective formation process is illustrated in FIG. 10. In step 216 of the process flow in FIG. 13, additional vias 60 are formed over the additional metal lines, and the respective formation process is illustrated in FIG. 11.

The embodiments of the present disclosure have some advantageous features. By forming vias and metal lines in separate steps, there is no need to fill trenches and via openings at the same time to form metal lines and vias. Hence, the filling of the traditional trench and via openings having high-aspect ratios is avoided. Accordingly, the resulting metal lines and vias formed in accordance with the embodiments of the present disclosure are free from the voids formed in the vias and metal lines. Furthermore, by selectively growing the metal lines on sidewalls of mandrels, the conventional trench filling process, which is prone to seam holes, is avoided.

In accordance with some embodiments of the present disclosure, a method includes etching a mandrel layer to form mandrel strips, and selectively depositing metal lines on sidewalls of the mandrel strips. During the selective deposition, top surfaces of the mandrel strips are masked by dielectric masks. The method further includes removing the mandrel layer and the dielectric masks, filling spaces between the metal lines with a dielectric material, forming via openings in the dielectric material, with top surfaces of the metal lines exposed to the via openings, and filling the via openings with a conductive material to form vias.

In accordance with alternative embodiments of the present disclosure, a method includes forming an etch stop layer, forming a mandrel layer over the etch stop layer, forming a dielectric mask layer over the mandrel layer, etching the dielectric mask layer and the mandrel layer using a same etching mask to form mandrel strips and dielectric masks, respectively, wherein the etch stop layer is exposed, selective depositing metal lines on sidewall surfaces of the mandrel strips, wherein a material of the metal lines is not deposited on exposed surfaces of the dielectric masks and the etch stop layer, removing the mandrel strips and the dielectric masks, and filling spaces between the metal lines with a dielectric layer.

In accordance with yet alternative embodiments of the present disclosure, an integrated circuit structure includes a metal line, which includes a first tilted sidewall; and a second tilted sidewall opposite to the first tilted sidewall. The first tilted sidewall and the second tilted sidewall tilt to a same first direction. A via is over and in contact with a top surface of the metal line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit structure comprising:
   a first metal line over a semiconductor substrate, the first metal line being ring-shaped in a top-down view, the first metal line comprising a first inner sidewall and a second inner sidewall opposite the first inner sidewall, wherein the first inner sidewall has a constant slope from a top portion of the first inner sidewall to a bottom portion of the first inner sidewall, wherein the second inner sidewall has a constant slope from a top portion of the second inner sidewall to a bottom portion of the second inner sidewall, and wherein a distance between the top portion of the first inner sidewall and the top portion of the second inner sidewall is less than a distance between the bottom portion of the first inner sidewall and the bottom portion of the second inner sidewall;

a dielectric layer surrounding the first metal line, wherein the first metal line encircles a portion of the dielectric layer, wherein a top surface of the dielectric layer is disposed above a top surface of the first metal line; and a conductive via extending through the dielectric layer and connected to the first metal line.

2. The integrated circuit structure of claim 1, wherein the first metal line further comprises a first outer sidewall opposite the first inner sidewall, wherein the first inner sidewall and the first outer sidewall are tilted at an angle to the semiconductor substrate.

3. The integrated circuit structure of claim 2, wherein the first metal line further comprises a second outer sidewall opposite the second inner sidewall, wherein the second inner sidewall and the second outer sidewall are tilted at the angle to the semiconductor substrate in a direction opposite the first inner sidewall and the first outer sidewall.

4. The integrated circuit structure of claim 1, further comprising:
an integrated circuit device over the semiconductor substrate;
an interlayer dielectric over the integrated circuit device, wherein the dielectric layer is disposed over the interlayer dielectric; and
a contact plug extending through the interlayer dielectric, the contact plug connecting the first metal line to the integrated circuit device.

5. The integrated circuit structure of claim 4, further comprising an etch stop layer between the interlayer dielectric and the dielectric layer, wherein top surfaces of the etch stop layer and the contact plug are coplanar.

6. The integrated circuit structure of claim 1, wherein top surfaces of the conductive via and the dielectric layer are coplanar.

7. The integrated circuit structure of claim 1, further comprising a second metal line over the semiconductor substrate and adjacent the first metal line, the second metal line being ring-shaped in the top-down view, the first metal line comprising a first outer sidewall opposite the first inner sidewall, the second metal line comprising a second outer sidewall facing the first outer sidewall, wherein a distance between a top portion of the first outer sidewall and a top portion of the second outer sidewall is greater than a distance between a bottom portion of the first outer sidewall and a bottom portion of the second outer sidewall.

8. An integrated circuit structure comprising:
a first etch stop layer over an inter-layer dielectric;
a first metal line over the first etch stop layer, the first metal line having a first sidewall and a second sidewall opposite the first sidewall, wherein the first sidewall is linear from an upper surface of the first metal line to a bottom surface of the first metal line;
a second metal line over the first etch stop layer and adjacent the first metal line, the second metal line having a third sidewall and a fourth sidewall opposite the third sidewall, wherein the third sidewall is linear from an upper surface of the second metal line to a bottom surface of the second metal line, wherein the first sidewall faces the third sidewall, wherein a bottom portion of the first sidewall is separated from a bottom portion of the third sidewall by a first positive distance, wherein a top portion of the first sidewall is separated from a top portion of the third sidewall by a second positive distance, and wherein the second positive distance is greater than the first positive distance; and
a dielectric layer surrounding the first metal line and the second metal line, wherein a portion of the dielectric layer is between the first sidewall and the second sidewall of the first metal line.

9. The integrated circuit structure of claim 8, further comprising a via contacting a top surface of the first metal line, wherein a top surface of a second etch stop layer over the dielectric layer is level with a top surface of the via.

10. The integrated circuit structure of claim 8, wherein the dielectric layer comprises a material having a dielectric constant less than 3.0.

11. The integrated circuit structure of claim 8, wherein the first metal line and the second metal line comprise tungsten, aluminum, or copper.

12. The integrated circuit structure of claim 8, wherein the first metal line and the second metal line are ring-shaped in a top-down view.

13. The integrated circuit structure of claim 8, wherein the first metal line and the second metal line comprise a portion of a first ring and a portion of a second ring, respectively, in a top-down view.

14. The integrated circuit structure of claim 8, further comprising a dielectric barrier layer between the dielectric layer and the etch stop layer, the first metal line, and the second metal line, wherein the first metal line and the second metal line comprise copper, wherein a relative difference between thicknesses of vertical portions of the dielectric barrier layer and horizontal portions of the dielectric barrier layer is less than 10 percent.

15. An integrated circuit structure comprising:
a first metal line comprising:
a first tilted sidewall; and
a second tilted sidewall opposite to the first tilted sidewall, wherein the second tilted sidewall is parallel to the first tilted sidewall;
a first via over and in contact with a top surface of the first metal line, wherein the first tilted sidewall and the second tilted sidewall tilt continuously from a bottom surface of the first metal line to an interface between the first metal line and the first via; and
a dielectric layer surrounding and in direct contact with the first tilted sidewall, the second tilted sidewall, and the first via.

16. The integrated circuit structure of claim 15 further comprising:
a second metal line comprising:
a third tilted sidewall; and
a fourth tilted sidewall opposite to the third tilted sidewall, wherein the fourth tilted sidewall is parallel to the third tilted sidewall, wherein the third tilted sidewall and the fourth tilted sidewall tilt in a direction opposite the first tilted sidewall and the second tilted sidewall; and
a second via over and in contact with a top surface of the second metal line.

17. The integrated circuit structure of claim 16, wherein the first metal line and the second metal line are immediate neighboring metal lines, wherein the first tilted sidewall of the first metal line and the third tilted sidewall of the second metal line face each other, and wherein a first distance between a top portion of the first tilted sidewall and a top portion of the third tilted sidewall is smaller than a second distance between a bottom portion of the first tilted sidewall and a bottom portion of the third tilted sidewall.

18. The integrated circuit structure of claim 16, wherein the first metal line and the second metal line are immediate neighboring metal lines, wherein the first tilted sidewall of the first metal line and the third tilted sidewall of the second metal line face each other, and wherein a first distance between a top portion of the first tilted sidewall and a top portion of the third tilted sidewall is greater than a second distance between a bottom portion of the first tilted sidewall and a bottom portion of the third tilted sidewall.

19. The integrated circuit structure of claim 15, further comprising:
   an etch stop layer, wherein the first metal line is disposed over the etch stop layer, and wherein the first metal line further comprises a third tilted sidewall and a fourth tilted sidewall opposite to the third tilted sidewall, wherein the fourth tilted sidewall is parallel to the third tilted sidewall, wherein the third tilted sidewall and the fourth tilted sidewall tilt in a direction opposite the first tilted sidewall and the second tilted sidewall.

20. The integrated circuit structure of claim 19, wherein the first metal line is ring-shaped in a top-down view, and wherein the first metal line encircles a portion of the dielectric layer.

* * * * *